United States Patent
Maeda et al.

(10) Patent No.: US 8,570,704 B2
(45) Date of Patent: Oct. 29, 2013

(54) SUBSTRATE HOLDER, SUBSTRATE HOLDER UNIT, SUBSTRATE TRANSPORT APPARATUS, AND SUBSTRATE BONDING APPARATUS

(75) Inventors: Hidehiro Maeda, Yokohama (JP); Masahiro Yoshihashi, Abiko (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/879,779

(22) Filed: Sep. 10, 2010

(65) Prior Publication Data

US 2011/0007447 A1 Jan. 13, 2011

Related U.S. Application Data

(63) Continuation of application No. PCT/JP2009/001134, filed on Mar. 13, 2009.

(30) Foreign Application Priority Data

Mar. 13, 2008 (JP) ................................ 2008-064926

(51) Int. Cl.
 *H01T 23/00* (2006.01)
(52) U.S. Cl.
 USPC .......................................... 361/234; 361/230
(58) Field of Classification Search
 USPC ............................................... 361/230–234
 See application file for complete search history.

(56) References Cited

U.S. PATENT DOCUMENTS 6,583,979 B1* 6/2003 Takahasi et al. ............. 361/234
7,508,646 B2* 3/2009 Emoto et al. ................. 361/234
2006/0027318 A1* 2/2006 Hashizume et al. .......... 156/285
2006/0046269 A1* 3/2006 Thompson et al. ........... 435/7.1
2007/0297887 A1* 12/2007 Tanaka .......................... 414/591

FOREIGN PATENT DOCUMENTS

JP 2007-222967 9/2007

OTHER PUBLICATIONS

Notification of the First Office Action issued Feb. 2, 2012 by State Intellectual Property Office of People's Republic of China in corresponding Chinese Application No. 20098010871.1.
English-language translation of Notification of the First Office Action issued Feb. 2, 2012 by State Intellectual Property Office of People's Republic of China in corresponding Chinese Application No. 20098010871.1.

* cited by examiner

*Primary Examiner* — Danny Nguyen
(74) *Attorney, Agent, or Firm* — Finnegan, Henderson, Farabow, Garrett & Dunner, L.L.P.

(57) ABSTRACT

A substrate holder is reliably transported in a state of holding a substrate. There is provided a substrate holder for holding a substrate by means of electrostatic force generated by power supplied from an external source. The substrate holder is to be transported in a state of holding the substrate. The substrate holder includes a holder body that is to have the substrate placed thereon, and a connector terminal that is externally exposed through the holder body, where the connector terminal is attachable to and detachable from an external power supply terminal. There is also provided a substrate transport apparatus for transporting a substrate holder holding a substrate by means of electrostatic force generated by power supplied from an external source. The substrate transport apparatus includes a placement section that has a placement surface on which the substrate holder is placed, where the placement section holds the substrate holder, and a power supply terminal that supplies power to the substrate holder placed on the placement surface.

64 Claims, 11 Drawing Sheets

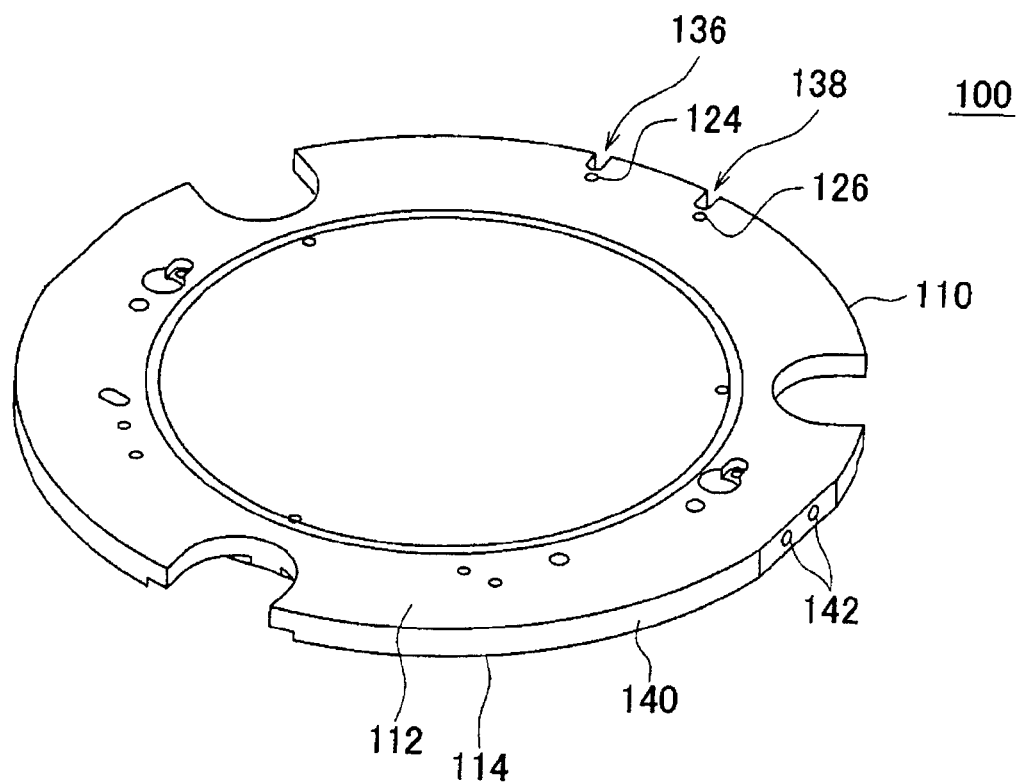
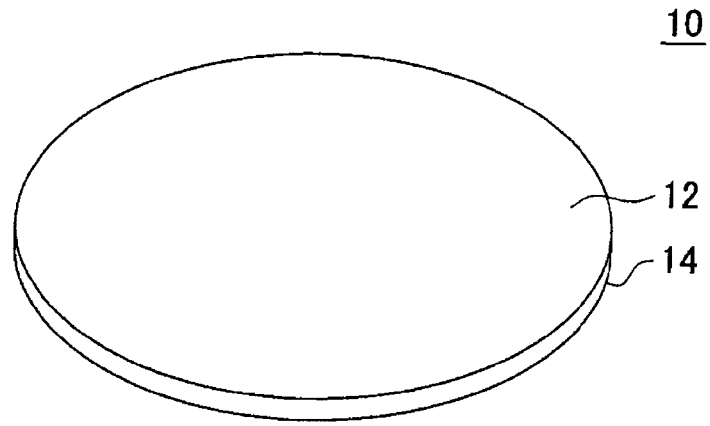
F I G. 4

SUBSTRATE HOLDER, SUBSTRATE HOLDER UNIT, SUBSTRATE TRANSPORT APPARATUS, AND SUBSTRATE BONDING APPARATUS

CROSS REFERENCE TO RELATED APPLICATION

The contents of the following Japanese patent application and International patent application are incorporated herein by reference, No. JP 2008-064926 filed on Mar. 13, 2008 and
No. PCT/JP2009/001134 filed on Mar. 13, 2009.

BACKGROUND

1. Technical Field

The present invention relates to a substrate holder, a substrate holder unit, a substrate transport apparatus, and a substrate bonding apparatus. More particularly, the present invention relates to a substrate holder, a substrate holder unit, a substrate transport apparatus, and a substrate bonding apparatus for holding a substrate.

2. Related Art

A known substrate transport apparatus is configured to transport a substrate holder holding a substrate as disclosed, for example, in Japanese Patent Application Publication No. 2006-332563. For example, the substrate transport apparatus is utilized to transport the substrate and substrate holder to an alignment apparatus, which is configured to align the substrate held by the substrate holder with another substrate to bond the substrates to each other. The substrate transport apparatus holds the substrate holder by adsorbing means such as vacuum adsorbing means.

An electrostatic chuck designed to hold a substrate may be provided with an anti-disengagement support as disclosed, for example, in Japanese Patent Application Publication No. 08-340683. The anti-disengagement support inwardly extends from the periphery of the electrostatic chuck, and moves between an anti-disengagement position at which the support covers the substrate in a non-contact manner and a retreat position at which the surface of the electrostatic chuck on which the substrate is to be placed is exposed, by rotating around the rotation axis that extends parallel to the substrate.

According to the disclosure of Japanese Patent Application Publication No. 08-340683, however, the electrostatic chuck is secured onto an apparatus such as an ion implanter. Therefore, it is not possible to transport the electrostatic chuck out of the apparatus while holding the substrate by electrostatic force.

SUMMARY

Therefore, it is an object of an aspect of the innovations herein to provide a substrate transport apparatus, which is capable of overcoming the above drawbacks accompanying the related art. The above and other objects can be achieved by combinations described in the claims.

A first aspect of the innovations may include a substrate holder for holding a substrate by means of electrostatic force generated by power supplied from an external source. The substrate holder to be transported in a state of holding the substrate. The substrate holder includes a holder body that is to have the substrate placed thereon, and a connector terminal that is externally exposed through the holder body, where the connector terminal is attachable to and detachable from an external power supply terminal.

A second aspect of the innovations may include a substrate holder unit to be transported in a state of holding a plurality of substrates therein. The substrate holder unit includes a first substrate holder that holds one of the plurality of substrates by means of electrostatic force generated by power supplied from an external source, and a second substrate holder that holds the other of the plurality of substrates by means of electrostatic force generated by power supplied from an external source. Here, the first and second substrate holders each includes a holder body that is to have the substrate placed thereon, and a connector terminal that is externally exposed through the holder body, where the connector terminal is attachable to and detachable from an external power supply terminal.

A third aspect of the innovations may include a substrate transport apparatus for transporting a substrate holder holding a substrate by means of electrostatic force generated by power supplied from an external source. The substrate transport apparatus includes a placement section that has a placement surface on which the substrate holder is placed, the placement section holding the substrate holder, and a power supply terminal that supplies power to the substrate holder placed on the placement surface.

A fourth aspect of the innovations may include a substrate bonding apparatus including the above-described substrate transport apparatus, and a bonding section that bonds together a plurality of substrates that are transported by the substrate transport apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 4 is a perspective view illustrating a substrate holder 100, which is held by the substrate transporter 300.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
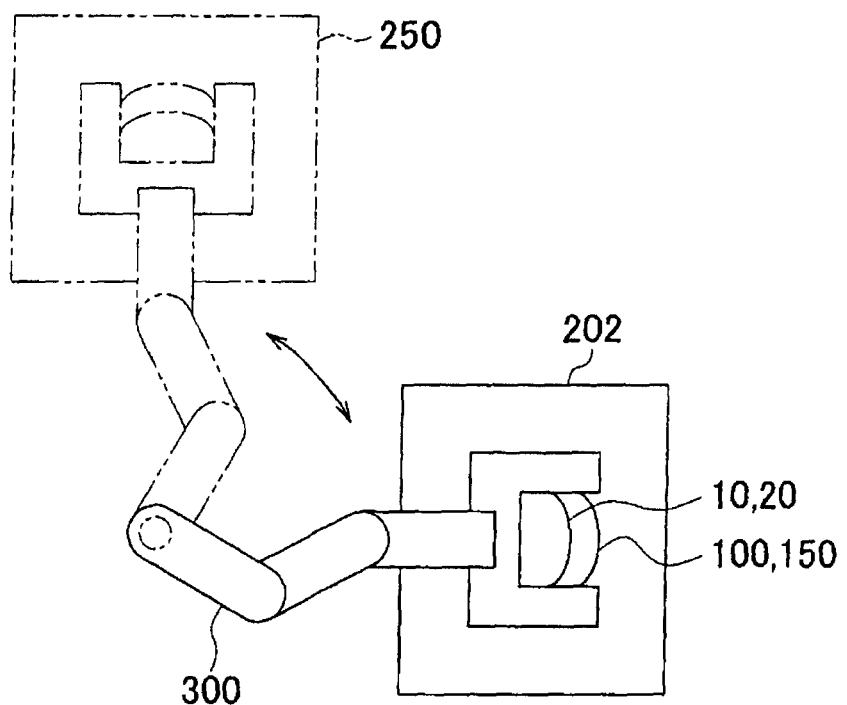
FIG. 1 is a plan view schematically illustrating a semiconductor stacking apparatus 200 relating to an embodiment of the present invention.

FIG. 1 is a plan view schematically illustrating a semiconductor stacking apparatus 200 relating to an embodiment of the present invention. The semiconductor stacking apparatus 200 manufactures a three-dimensionally integrated semiconductor device by overlapping and stacking a plurality of substrates 10 and 20 on one another. For example, the substrates 10 and 20 are wafers having thereon a plurality of semiconductor devices formed by semiconductor components. The semiconductor stacking apparatus 200 of FIG. 1 is constituted by an aligner 202 that aligns and overlaps substrate holders 100 and 150 respectively holding the substrates 10 and 20 to each other, and a heating and pressing section 250 that applies heat and pressure to the substrate holders 100 and 150, which have been overlapped on one another by the aligner 202, to stack the substrates 10 and 20 held by the substrate holders 100 and 150. The semiconductor stacking apparatus 200 is an exemplary substrate bonding apparatus.

The semiconductor stacking apparatus 200 further includes a substrate transporter 300 that transports the substrates 10 and 20 and the substrate holders 100 and 150 between the aligner 202 and the heating and pressing section 250. The substrate transporter 300 may be designed to transport both or either of the substrate holders 100 and 150.

Figure 2:
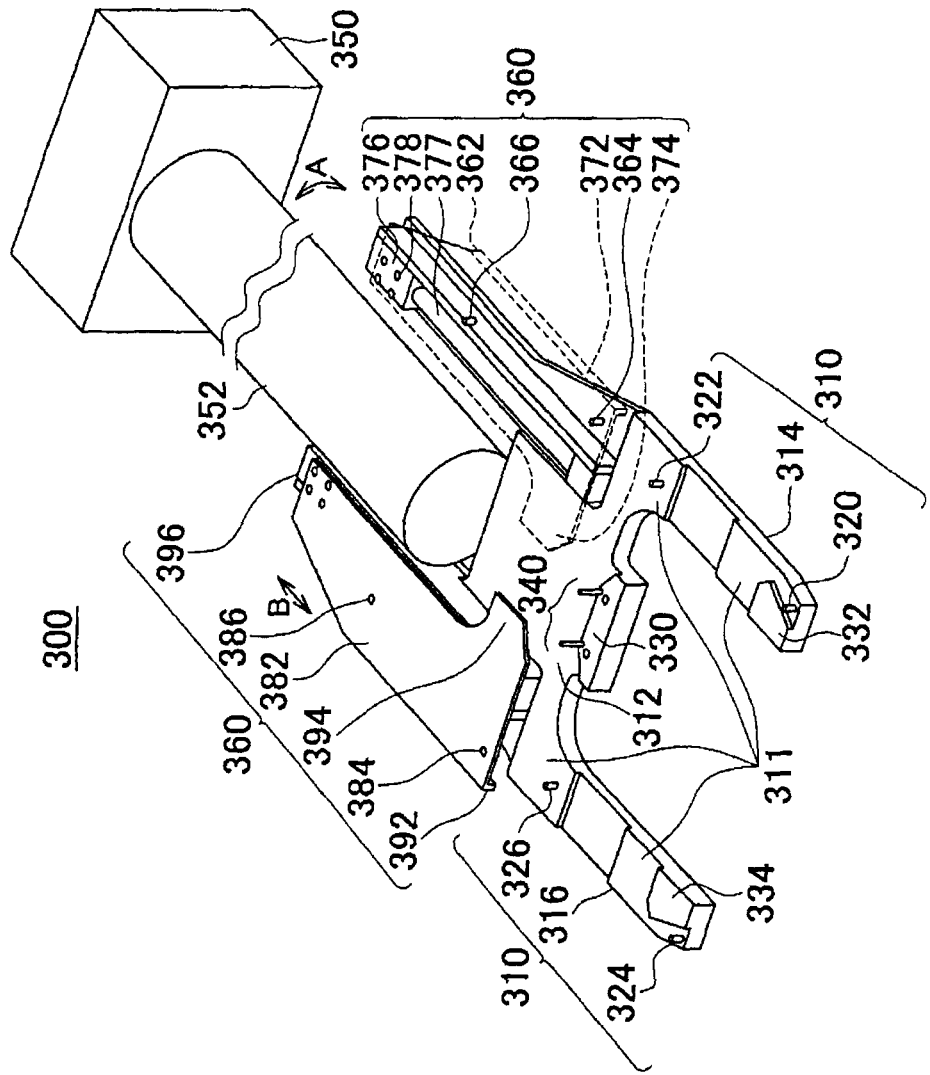
FIG. 2 is a perspective view illustrating a substrate transporter 300, which is shown as an exemplary substrate transport apparatus.

FIG. 2 is a perspective view illustrating the substrate transporter 300, which is shown as an exemplary substrate transport apparatus. The substrate transporter 300 includes a placement section 310 that has the substrate holders 100 and 150 placed thereon and holds the substrate holders 100 and 150, a rotation section 350 that rotates the placement section 310 in the direction designated by the arrow A in FIG. 2, and an anti-disengagement section 360 that moves back and forth relative to the placement section 310 in the directions designated by the arrow B in FIG. 2. The rotation section 350 has an axis section 352 that is coupled to the placement section 310.

The placement section 310 is substantially squarely U-shaped by having a base 312 that is coupled to the axis section 352, and a pair of arms 314 and 316 that extend, from the ends of the base 312 that are positioned opposite to each other in the direction perpendicular to the direction in which the axis section 352 extends, parallel to the direction in which the axis section 352 extends. One of the surfaces (the upper surface in FIG. 2) of the base 312, one of the surfaces (the upper surface in FIG. 2) of the arm 314, and one of the surfaces (the upper surface in FIG. 2) of the arm 316 constitute a placement surface 311 on which the substrate holder 100 is to be placed. In the following, the orientation of the placement section 310 in which the placement surface is positioned under the substrate holder 100, in other words, the placement surface 311 faces upward will be referred to as a normal orientation, and the orientation of the placement section 310 in which the placement surface is positioned above the substrate holder 100, in other words, the placement surface 311 faces downward will be referred to as a reversed orientation. The base 312 is coupled to the axis section 352 via a coupler, and the base 312 rotates as the axis section 352 rotates. FIG. 2 does not show the coupler.

The placement section 310 has a plurality of placement protrusions that protrude upwards during the normal orientation of the placement section 310. In the example shown in FIG. 2, the placement section 310 has four placement protrusions 320, 322, 324, and 326, which are pins. According to the embodiment shown in FIG. 2, the two placement protrusions 320 and 324 of the four placement protrusions 320, 322, 324, and 326 are respectively positioned at the free ends of the arms 314 and 316, and the remaining two placement protrusions 322 and 326 are respectively positioned at the base ends of the arms 314 and 316.

The placement section 310 further has an adsorbing section 330 that is positioned at the base 312, an adsorbing section 332 that is positioned at the free end of the arm 314, and an adsorbing section 334 that is positioned at the free end of the arm 316. These adsorbing sections 330, 332, and 334 adsorb by means of vacuum the substrate holder 100 being placed on the placement surface. The placement section 310 further has power supply terminals 340 in the region of the adsorbing section 330.

The anti-disengagement section 360 has a pair of flat-plate sections 362 and 382. The flat-plate sections 362 and 382 are arranged substantially parallel to the placement surface of the placement section 310.

In the example shown in FIG. 2, the flat-plate sections 362 and 382 are shaped like a rectangle that extends along the direction in which the axis section 352 extends. The flat-plate sections 362 and 382 are arranged on both sides of the axis section 352 and above the placement surface with a space therebetween. The distance between the flat-plate sections 362 and 382 is set so as to be smaller than the diameter of the substrates 10 and 20.

The anti-disengagement section 360 further has a pair of actuators 376 and 396. The actuators 376 and 396 are each constituted by a conventionally well-known pneumatic cylinder having a guiding section 377 that extends from one of the ends of the base 312 in an opposite direction to the direction in which a corresponding one of the arms 314 and 316 extends, and a movable section 378 that is movable along the guiding section. In FIG. 2, the guiding and movable sections of the actuator 396 are hidden under the flat-plate section 382 and not seen. The guiding section 377 of the actuator 376 is parallel to the guiding section 377 of the actuator 396. The flat-plate sections 362 and 382 are respectively fixed to the movable sections at first ends thereof, and are moved back and forth along the direction in which the arms 314 and 316 extend by the movable sections moving along the guiding sections. Here, the flat-plate sections 362 and 382 move parallel to each other. The guiding sections are sized in length so that the placement surface is not covered by the flat-plate sections 362 and 382 and thus exposed when the movable sections are positioned at the free ends of the guiding sections and the flat-plate sections 362 and 382 are arranged above the placement surface 311 when the movable sections are positioned at the base ends of the guiding sections. Since the distance between the flat-plate sections 362 and 382 is set smaller than the diameter of the substrates 10 and 20 as described above, the flat-plate sections 362 and 382 cover a portion of a surface 14 (see FIG. 4) of the substrate 10 and a portion of a surface 114 (see FIG. 4) of the substrate holder 100 in a non-contact manner when the flat-plate sections 362 and 382 have moved to above the placement surface 311. In other words, the flat-plate sections 362 and 382 can move between the anti-disengagement position in which they partly cover the substrate 10 and the substrate holder 100 and the retreat position in which they allow the substrate 10 and the substrate holder 100 to move along the vertical direction of the placement section 310.

The flat-plate sections 362 and 382 each have a plurality of flat-plate protrusions that protrude downward when the placement section 310 takes the normal orientation. In the example shown in FIG. 2, the flat-plate section 362 has two flat-plate protrusions 364 and 366, and the flat-plate section 382 has two flat-plate protrusions 384 and 386. In the embodiment shown in FIG. 2, the flat-plate protrusions 364 and 384 are provided at the second ends of the flat-plate sections 362 and 382, and the flat-plate protrusions 366 and 386 are provided around the centers of the flat-plate sections 362 and 382. Each of the flat-plate sections 362 and 382 has two edges that oppose each other in the width direction. Here, one of the two edges that faces away from the other of the flat-plate sections 362 and 382 has a folded section that extends from the edge toward the placement surface. The folded sections of the flat-plate sections 362 and 382 are designated by reference numerals 372 and 392 in FIG. 2. The distance between the folded sections 372 and 392 is set so as to be larger than the diameter of the substrate holders 100 and 150. The second ends of the flat-plate sections 362 and 382 have extended sections 374 and 394 that extend from the second ends toward each other.

Figure 3:
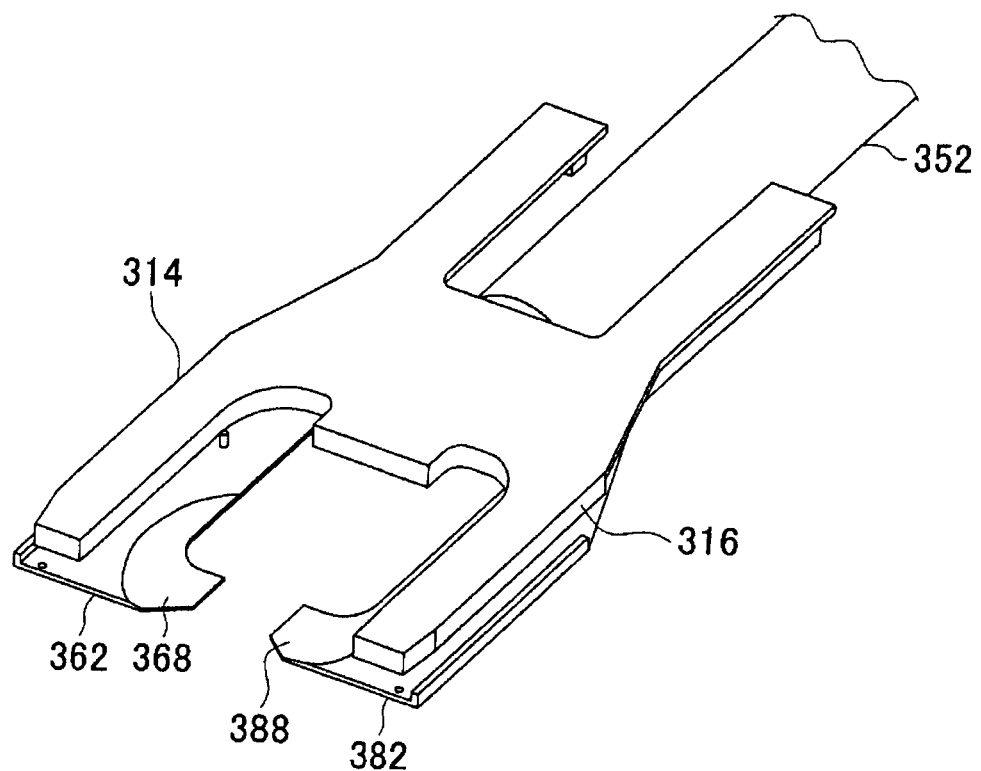
FIG. 3 is a perspective view illustrating the reversed orientation of the substrate transporter 300.

FIG. 3 is a perspective view illustrating the reversed orientation of the substrate transporter 300. As shown in FIG. 3, the surface of each of the flat-plate sections 362 and 382 that faces the placement surface, that is to say, the internal surface of each of the flat-plate sections 362 and 382, and the surface of each of the extended portions 374 and 394 that faces the placement surface have recessed sections 368 and 388 that are formed in accordance with the size of the substrate 10. The recessed sections 368 and 388 are formed in the flat-plate sections 362 and 382 so as to face the substrates 10 and 20 on the placement surface while the flat-plate sections 362 and 382 are in the anti-disengagement position. Thus, when the placement section 310 takes the reversed orientation and the substrate 10 disengages from the substrate holder 100 to be supported by the flat-plate sections 362 and 382, the substrate 10 fits into the recessed sections 368 and 388, thereby being prevented from moving in the direction parallel to the placement surface 311 and falling out.

FIG. 4 is a perspective view illustrating the substrate holder 100, which is to be held by the substrate transporter 300. Since the substrate holders 150 and 100 are configured in the same manner, only the substrate holder 100 is described in the following.

The substrate holder 100 has a disk-shaped holder body 110 having a larger diameter than the substrate 10. The substrate holder 100 is configured to have the substrate 10 placed on a surface 114 of the holder body 110 and holds the substrate 10 on the surface 114. While being held, the substrate 10, which has devices formed on a front surface 14, is in such an orientation that a back surface 12 is in contact with the surface 114. Here, the substrate holder 100 adsorbs and holds the substrate 10 by means of an electrostatic force generated by power supplied from an external source. The substrate holder 100 is placed on the placement section 310 in such an orientation that a surface 112 is in contact with the placement surface of the placement section 310. The external source represents a component that moves independently from the substrate holder 100, does not constitute a part of the substrate holder 100, and is external to the substrate holder 100, such as the substrate transporter 300 of the semiconductor stacking apparatus 200 or the like.

The substrate holder 100 further has retreat grooves 136 and 138 that penetrate through the holder body 110 in the thickness direction and are recessed radially inward from a lateral surface 140, and conductors 124 and 126 that are arranged radially inside of the retreat grooves 136 and 138. The lateral surface 140 of the substrate holder 100 has a pair of lateral-surface holes 142. The holes 142 are recessed radially inward in the holder body 110 and are arranged with a space being provided therebetween in the circumference direction of the holder body 110. Although not shown in FIG. 4, another pair of lateral-surface holes 142 are symmetrically provided with respect to the center of the surface 114.

Figure 5:
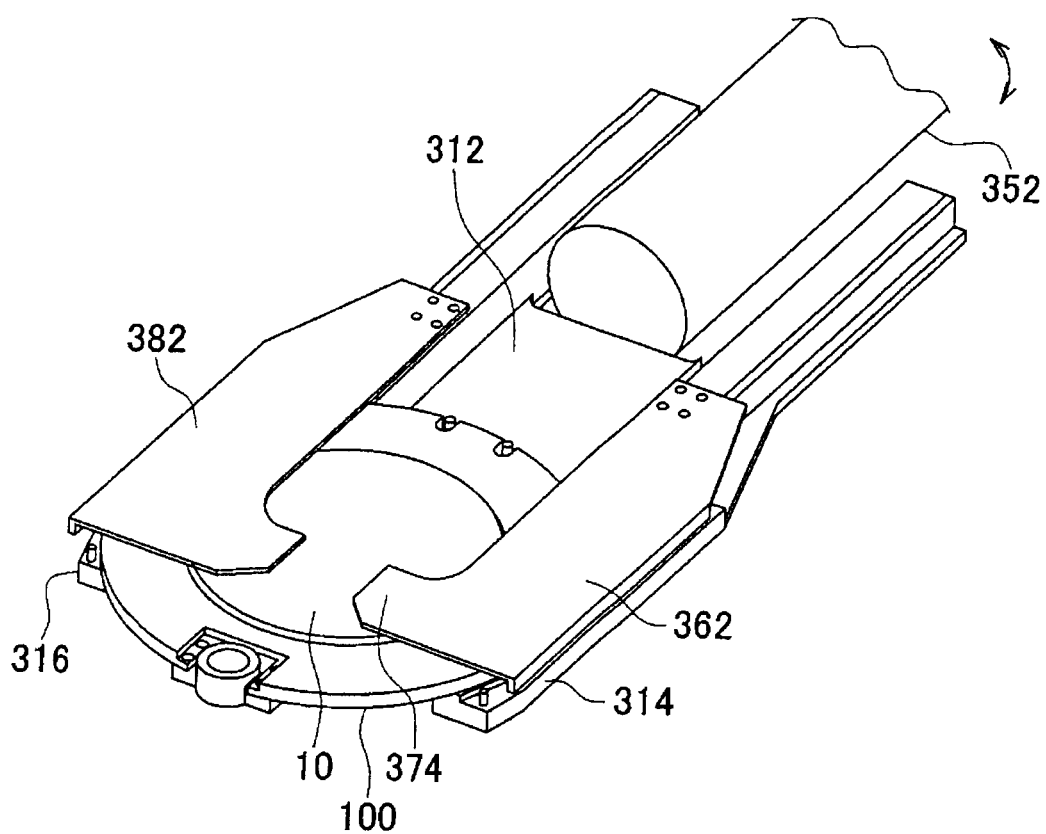
FIG. 5 is a perspective view illustrating that flat-plate sections 362 and 382 have moved to above a substrate 10.

FIG. 5 is a perspective view illustrating that the flat-plate sections 362 and 382 have moved to the anti-disengagement position. As the placement section 310 holding the substrate holder 100 is rotated to the reversed orientation, the substrate holder 100 may become less tightly held by the placement section 310 or the substrate 10 may become less tightly held by the substrate holder 100 for some reason. During the state shown in FIG. 5, however, the flat-plate sections 362 and 382 support from below the substrate holder 100, which may have disengaged from the placement section 310, or the substrate 10, which may have disengaged from the substrate holder 100. Thus, the flat-plate sections 362 and 382 can prevent the substrate holder 100 and the substrate 10 from falling out to a floor.

When the substrate holder 100 is attached to or detached from the placement section 310 during the normal orientation of the placement section 310 achieved by the rotation section 350 as shown in FIG. 2, the flat-plate sections 362 and 382 are retreated to the retreat position. Thus, the flat-plate sections 362 and 382 do not obstruct the attachment and detachment of the substrate holder 100 and the like.

Figure 6:
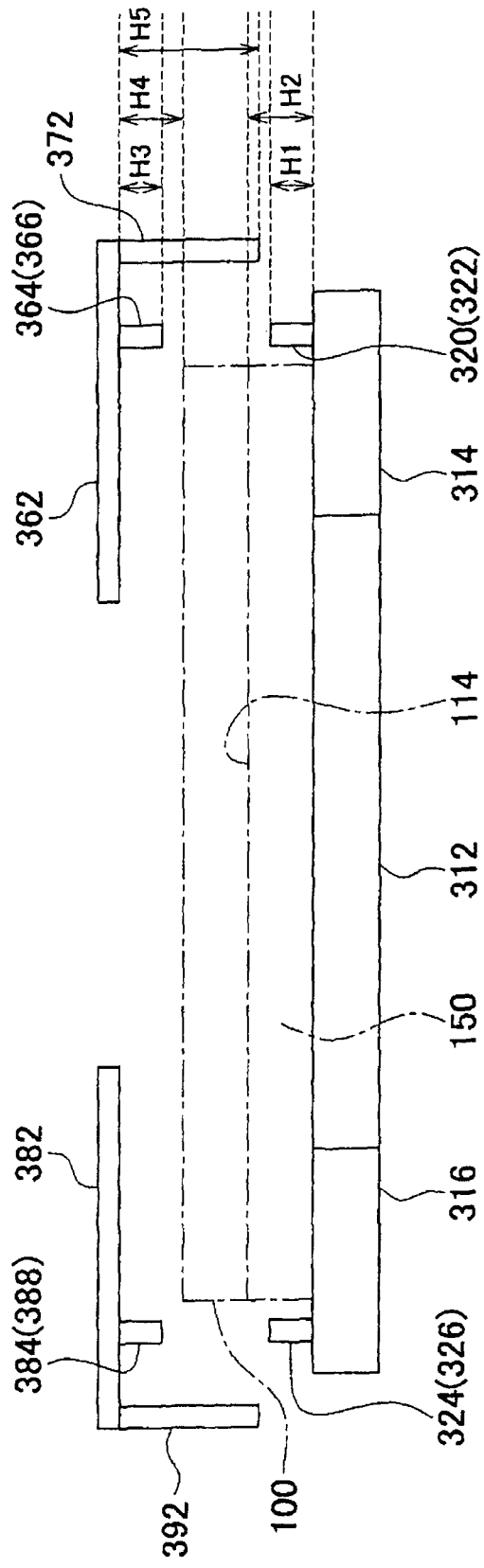
FIG. 6 is a front view illustrating the substrate transporter 300 in a direction in which an axis section 352 extends.

FIG. 6 is a front view illustrating the substrate transporter 300 in the direction in which the axis section 352 extends. As shown in FIG. 6, the flat-plate sections 362 and 382 are positioned above the placement surface so as to be higher than the two overlapped substrate holders 100 and 150. Thus, the flat-plate sections 362 and 382 can be prevented from contacting the substrate holders 100 and 150 when moving back and forth.

The placement protrusions 320, 322, 324 and 326 are arranged outside the substrate holder 150 in the direction parallel to the placement surface 311. Thus, the substrate holder 150 can be prevented from freely moving in the direction parallel to the placement surface 311 during the normal orientation. The placement protrusions 320, 322, 324 and 326 have such a dimension H1 that the placement protrusions 320, 322, 324 and 326 do not contact the flat-plate sections 362 and 382 when the flat-plate sections 362 and 382 move back and forth. According to the embodiment shown in FIG. 6, the dimension H1 is smaller than a thickness H2 of the substrate holder 150, which is positioned closer to the placement surface. Thus, the flat-plate sections 362 and 382 can smoothly move back and forth without contacting the placement protrusions 320, 322, 324 and 326.

The flat-plate protrusions 364, 366, 384, and 386 are arranged outside the substrate holder 100 in the direction parallel to the placement surface 311. Thus, the substrate holder 100 can be prevented from moving in the direction parallel to the placement surface 311 when the substrate holder 100 is supported by the flat-plate sections 362 and 382 during the reversed orientation. The flat-plate protrusions 364, 366, 384 and 386 have such a dimension H3 that the flat-plate protrusions 364, 366, 384 and 386 do not contact the substrate holder 100 when the flat-plate sections 362 and 382 move back and forth. According to the embodiment shown in FIG. 6, the dimension H3 is smaller than a gap H4 between the substrate holder 100, which is positioned closer to the flat-plate sections 362 and 382, and the flat-plate sections 362 and 382. Thus, the flat-plate sections 362 and 382 can smoothly move back and forth without the flat-plate protrusions 364, 366, 384, and 386 contacting the substrate holder 100.

The folded sections 392 and 372 are positioned outside the substrate holders 100 and 150. The folded sections 392 and 372 have such a dimension H5 that the folded sections 392 and 372 extend from the flat-plate sections 362 and 382 towards the placement surface beyond the surface 114 of the substrate holder 150, which is positioned closer to the placement surface. Thus, the substrate holders 100 and 150 can be prevented from moving in the direction parallel to the placement surface and thus from falling off during the normal orientation, the reversed orientation, and rotation.

With the above-described configuration, the substrate 10 and the substrate holder 100 can be prevented from falling out of the substrate transporter 300 during the reversed orientation of the substrate transporter 300. Since the flat-plate sections 362 and 382 of the anti-disengagement section 360 move back and forth along the axial direction of the axis section 352, that is to say, the direction parallel to the substrate 10, the space required to enable the flat-plate sections 362 and 382 to move can be made smaller when compared with the case where the flat-plate sections 362 and 382 rotate in the direction parallel to the substrate 10. Furthermore, even when the substrate holders 100 and 150 stacked on one another are placed on the substrate transporter 300, the substrate holders 100 and 150 can be prevented from falling out during the reversed orientation of the substrate transporter 300. Furthermore, while being transported by the substrate transporter 300, the substrates 10 and 20 and the substrate holders 100 and 150 can be prevented from being misaligned in the direction parallel to the placement surface 311.

Figure 7A:
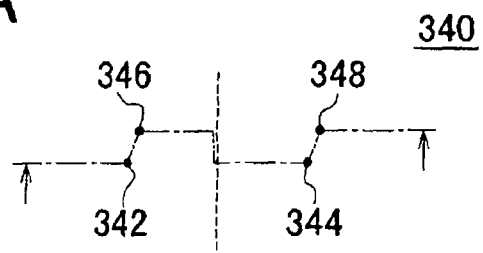
FIGS. 7A-7C are plan views illustrating power supply terminals 340.
Figure 7B:
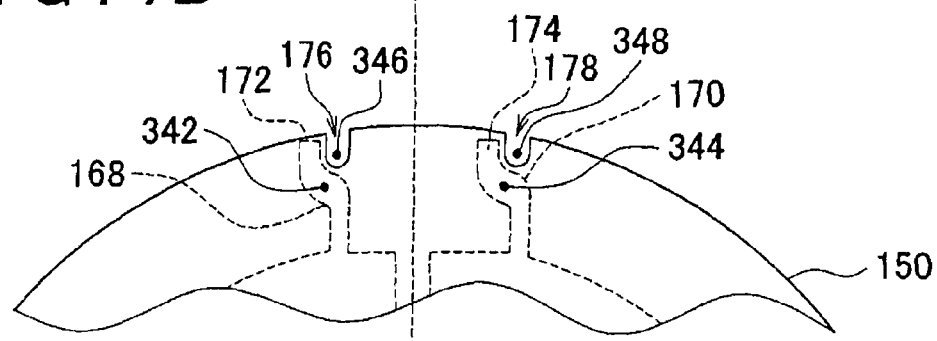
Figure 7C:
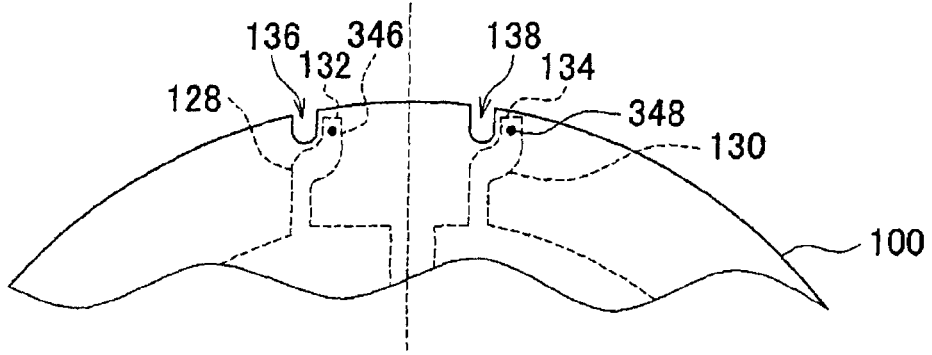
Figure 8A:
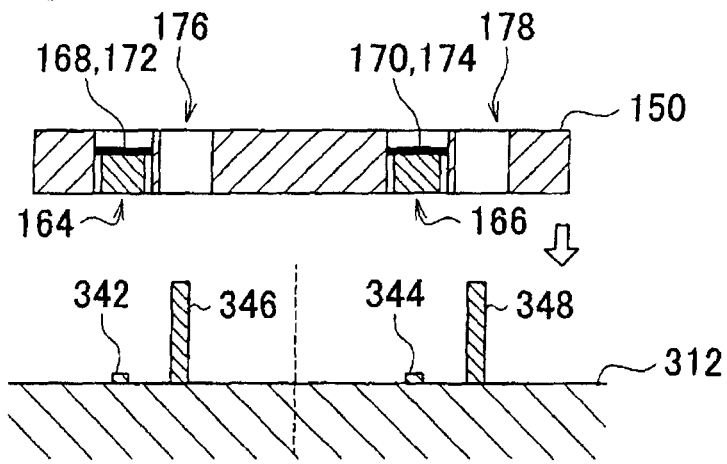
FIGS. 8A-8C are cross-sectional views illustrating the power supply terminals 340 of FIG. 7.

FIGS. 7A-7C are plan views illustrating the power supply terminals 340. FIG. 8A is a cross-sectional view illustrating the power supply terminals 340 cut along the alternate long and short dash line in FIG. 7A and seen in the direction designated by the arrows in FIG. 7A. The power supply terminals 340 are electrically connected to the electrodes of the substrate holders 100 and 150, which are adsorbed by the adsorbing section 330.

As shown in FIGS. 7A and 8A, the power supply terminals 340 include a pair of lower power supply terminals 342 and 344 and a pair of upper power supply terminals 346 and 348. These power supply terminals 342, 344, 346, and 348 protrude upward from the base 312 during the normal orientation. The lower power supply terminals 342 and 344 and the upper power supply terminals 346 and 348 are arranged on the placement surface, that is to say, on the upper surface of the adsorbing section 330 of FIG. 2 and protrude upward in the drawing. The lower power supply terminals 342 and 344 have a height smaller than the thickness of the lower substrate holder 150, and are positioned symmetrically with respect to the rotation axis (represented by the dashed line in FIG. 8A) of the placement section 310. On the other hand, the upper power supply terminals 346 and 348 have a height larger than the thickness of the lower substrate holder 150 and are asymmetrically positioned with respect to the rotation axis of the placement section 310.

As shown in FIG. 8A, the substrate holder 150 has conductors 164 and 166 that are positioned in correspondence with the lower power supply terminals 342 and 344, and has retreat grooves 176 and 178 that are positioned in correspondence with the upper power supply terminals 346 and 348. As shown in FIG. 7B, the substrate holder 150 further has electrode base sections 168 and 170 that are electrically connected to the internal electrode of the substrate holder 150, and has electrode end sections 172 and 174 that are positioned at the ends of the electrode base sections 168 and 170. As shown in FIG. 8A, the electrode base sections 168 and 170 are electrically connected to the conductors 164 and 166. The electrode end sections 172 and 174 are asymmetrically positioned with respect to the rotation axis of the placement section 310 in a different manner than the retreat grooves 176 and 178, and externally exposed on the surface (the upper surface in FIG. 8A) of the substrate holder 150 that is opposite to the surface on which the conductors 164 and 166 are arranged. Here, the conductors 164 and 166, the electrode base sections 168 and 170, and the electrode end sections 172 and 174 are exemplary connector terminals.

Figure 8B:
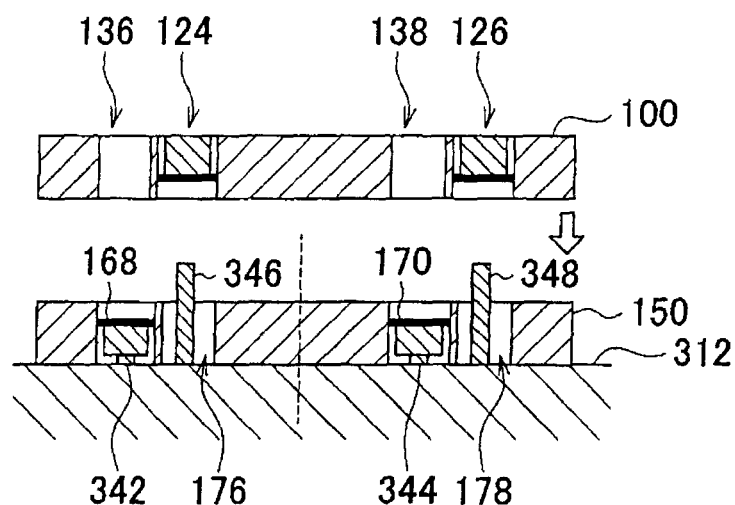
Figure 8C:
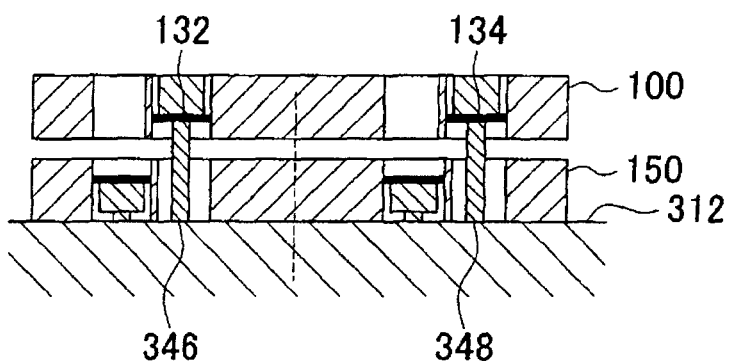

Likewise, the substrate holder 100 has the conductors 124 and 126, the retreat grooves 136 and 138, electrode base sections 128 and 130, and electrode end sections 132 and 134, as shown in FIGS. 7C, 8B, and 8C. The conductors 124 and 126, the retreat grooves 136 and 138, the electrode base sections 128 and 130, and the electrode end sections 132 and 134 of the substrate holder 100 are arranged in the same manner as the conductors 164 and 166, the retreat grooves 176 and 178, the electrode base sections 168 and 170, and electrode end sections 172 and 174 of the substrate holder 150, when the substrate holders 100 and 150 face the same direction, i.e., when the surfaces of the substrate holders 100 and 150 on which the substrates are to be placed face the same direction.

As shown in FIGS. 7B and 8B, when the substrate holder 150 is placed on the substrate transporter 300, the lower power supply terminals 342 and 344 come into contact with the conductors 164 and 166. Thus, the lower power supply terminals 342 and 344 are electrically connected to the electrode base sections 168 and 170 via the conductors 164 and 166 to supply power used for electrostatic adsorption. Here, the upper power supply terminals 346 and 348 are housed within the retreat grooves 176 and 178 so as to be electrically insulated from the substrate holder 150.

As shown in FIGS. 7C and 8C, when the substrate holder 100 is placed on the substrate holder 150, the upper power supply terminals 346 and 348 come into contact with the electrode end sections 132 and 134 of the substrate holder 100 since the electrode end sections 132 and 134 coincide in position with the retreat grooves 176 and 178. Thus, the upper power supply terminals 346 and 348 are electrically connected to the electrode end sections 132 and 134 to supply power used for electrostatic adsorption. Here, the lower power supply terminals 342 and 344 are housed within the substrate holder 150 so as to be electrically insulated from the substrate holder 100.

The upper power supply terminals 346 and 348 and the lower power supply terminals 342 and 344 are preferably formed by spring probes, elastic leaf springs or the like, so as to elastically contact the connector terminals of the substrate holders 100 and 150. Thus, more reliable electrical connection can be realized between the substrate transporter 300 and the substrate holders 100 and 150. The stroke of the elastic upper power supply terminals 346 and 348 and lower power supply terminals 342 and 344, within which the contact is maintained between the connector terminals of the substrate holders 100 and 150 and the upper power supply terminals 346 and 348 and lower power supply terminals 342 and 344, is preferably set longer than the height H4 shown in FIG. 6. Thus, when the substrate holders 100 and 150 fall out onto the flat-plate sections 362 and 382, the substrates 10 and 20 can be prevented from falling out of the substrate holders 100 and 150.

The externally exposed areas of the conductors 164 and 166 and the electrode end sections 132 and 134 are preferably selected larger than the tolerance accepted while the substrate transporter 300 holds and transports the substrate holders 100 and 150. Thus, more reliable electrical connection can be realized while the substrate transporter 300 holds and transports the substrate holders 100 and 150.

With the above-described configuration, when the substrate holders 100 and 150 having the same configuration are stacked on one another with one of the substrate holders 100 and 150 being turned over, the substrate holders 100 and 150 can separately receive power. Specifically speaking, when the substrate holders 100 and 150 are stacked on one another with the substrates being sandwiched therebetween, the conductors 164 and 166 of the substrate holder 150 are externally exposed toward the base 312 (downward in FIGS. 8A to 8C), the conductors 124 and 126 of the substrate holder 100 are externally exposed through the holder body toward the base 312 (downward in FIGS. 8A to 8C) at different positions from the conductors 164 and 166 of the substrate holder 150 when seen from above, and the electrode end sections 132 and 134 of the substrate holder 100 are also externally exposed through the holder body toward the base 312 via the retreat grooves 176 and 178. Thus, power can be supplied to both of the substrate holders 100 and 150 while the substrate holders 100 and 150 are being stacked on one another. Accordingly, the substrate holders 100 and 150 can be transported while being power-supplied. Of course, it is possible that only the substrate holder 150 is held and power-supplied.

When the substrate holders 100 and 150 are stacked on one another with the surfaces on which the substrates are placed facing each other, the retreat grooves 176 and 178 of the substrate holder 150 are positioned so as to overlap the electrode end sections 132 and 134 of the substrate holder 100. Thus, when two substrate holders on which the retreat grooves electrode end sections and the like are arranged in the same manner are stacked on one another with one of the substrate holders being turned over, the connector terminals of both of the two substrate holders can be made externally exposed. Consequently, common components and manufacturing processes can be used, which can reduce the cost.

In FIGS. 7A to 7C and FIGS. 8A to 8C, the substrate holder 150 is first placed on the substrate transporter 300 and the substrate holder 100 is afterward placed on the substrate holder 150 for the purpose of description, but the placing sequence is not limited to such. For example, after the substrate holders 100 and 150 are stacked on one another, both of the substrate holders 100 and 150 may be simultaneously placed on the substrate transporter 300. The retreat grooves 176 and 178 are formed as notches or cuts, but may be alternatively formed as holes. In either case, the retreat grooves 176 and 178 preferably penetrate the holder body in the thickness direction. The retreat grooves and holes are exemplary exposing and penetrating sections.

Figure 9:
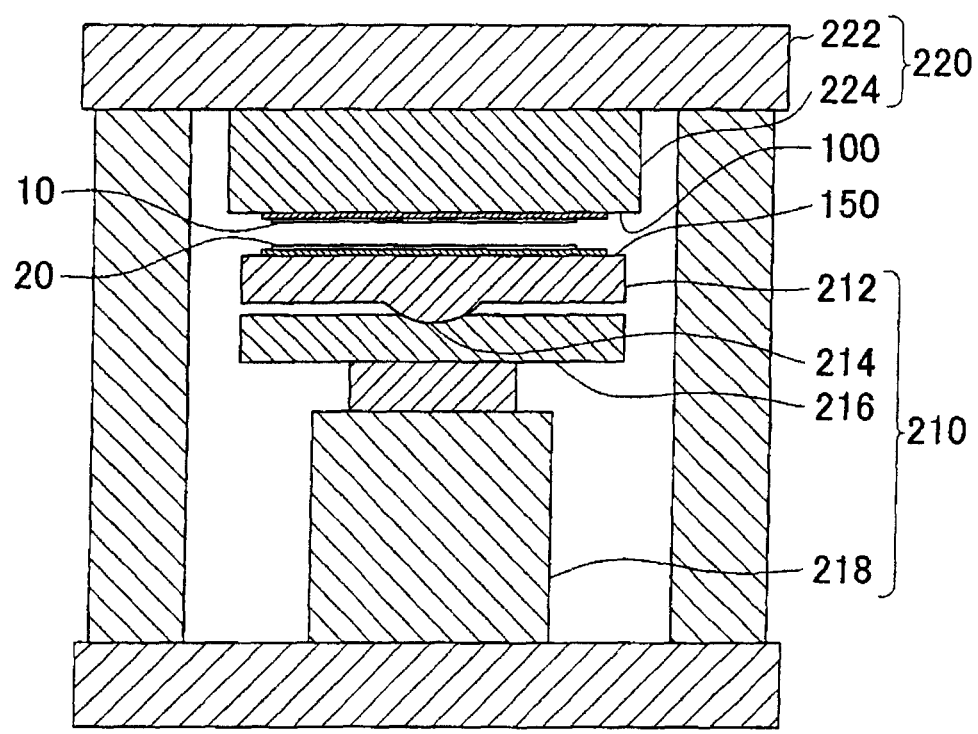
FIG. 9 is a side view schematically illustrating an aligner 202.

FIG. 9 is a side view schematically illustrating the aligner 202. The aligner 202 has an upper stage 220 that holds the substrate holder 100 and a lower stage 210 that holds the substrate holder 150.

The lower stage 210 is constituted by a lower stage body 212, a spherical seat 214, a support 216, and a lift member 218, which are arranged in the stated order from top to down with the lower stage body 212 being closest to the upper stage 220. The lower stage body 212 adsorbs and holds the substrate holder 150, which has been transported by the substrate transporter 300 and holds the substrate 20. The lower stage body 212 adsorbs the substrate holder 150 by means of vacuum. Alternatively or additionally, the lower stage body 212 may adsorb the substrate holder 150 by means of electrostatic force. The lower stage body 212 is coupled to the support 216 through the spherical seat 214. The lift member 218 moves the support 216 closer to or away from the upper stage 220, in other words, moves the support 216 up and down in the vertical direction. The lower stage 210 can be aligned to the upper stage 220 by moving in the direction parallel to the surface of the substrate 20, that is to say, in the horizontal direction.

The upper stage 220 is constituted by an upper stage body 222 and an adsorbing plate 224 that is attached to the upper stage body 222 and adsorbs the substrate holder 100 holding the substrate 10. The adsorbing plate 224 adsorbs the substrate holder 100, which has been transported by the substrate transporter 300, by means of vacuum. Alternatively or additionally, the adsorbing plate 224 may adsorb the substrate holder 100 by means of electrostatic force.

With the above-described configuration, the aligner 202 aligns and stacks the substrate holders 100 and 150, which have been transported by the substrate transporter 300. The substrate transporter 300 transports to the heating and pressing section 250 the substrate holders 100 and 150, which have been stacked on one another by the aligner 202.

Figure 10:
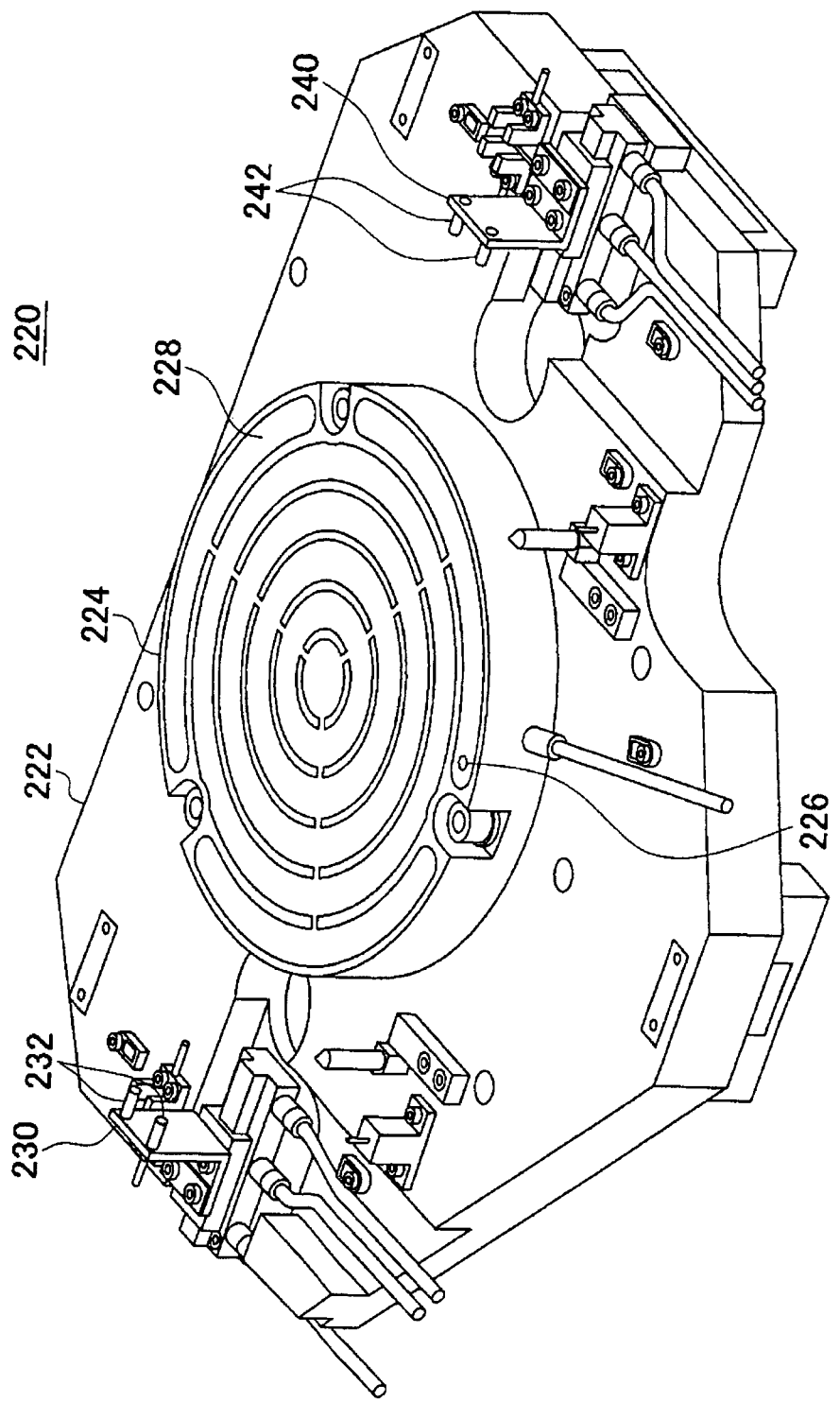
FIG. 10 is a partial perspective view illustrating an upper stage 220 upside-down.

FIG. 10 is a partial perspective view illustrating the upper stage 220 upside-down. As shown in FIG. 10, the adsorbing plate 224 is attached to the upper stage body 222. The adsorbing plate 224 has substantially the same profile as the substrate holder 100, and has an adsorption hole 226 and an adsorption groove 228 coupled to the adsorption hole 226. A negative pressure in the adsorption hole 226 and the adsorption groove 228 enables the adsorbing plate 224 to vacuum-adsorb the substrate holder 100.

The upper stage 220 further has a pair of anti-disengagement blocks 230 and 240. The anti-disengagement blocks 230 and 240 are arranged so as to sandwich the adsorbing plate 224 in the lateral direction of the upper stage 220. The anti-disengagement blocks 230 and 240 respectively have a pair of pins 232 and a pair of pins 242. The pins 232 and 242 extend in the lateral direction of the upper stage 220.

Figure 11:
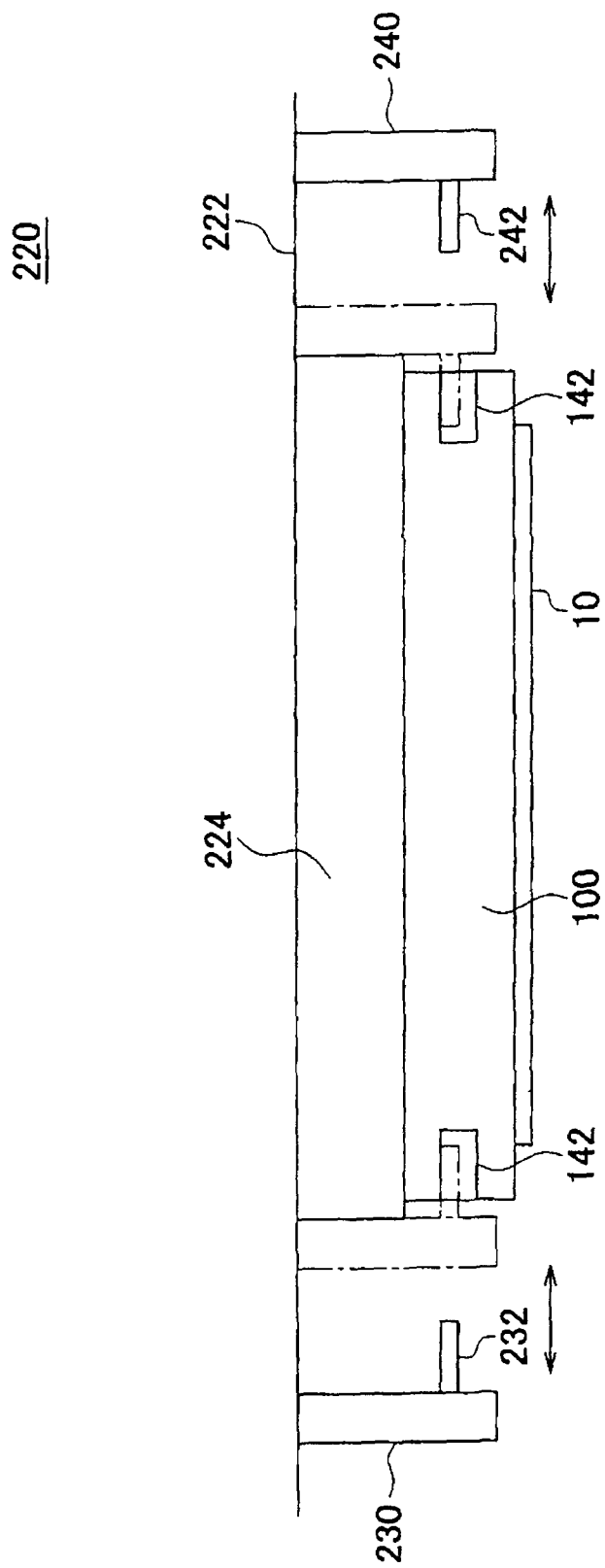
FIG. 11 is a side view illustrating how anti-disengagement blocks 230 and 240 of the upper stage 220 operate.

FIG. 11 is a side view illustrating how the anti-disengagement blocks 230 and 240 operate. When the adsorbing plate 224 holds the substrate holder 100, the anti-disengagement blocks 230 and 240 are moved closer to the substrate holder 100 by actuators such as pneumatic cylinders so that the pins 232 and 242 are correspondingly inserted into the lateral-surface holes 142 of the substrate holder 100. After the pins 232 and 242 have been inserted into the lateral-surface holes 142, the vacuum adsorption realized by the adsorbing section 330 and the like is terminated and the substrate transporter 300 retreats from the upper stage 220. Thus, the substrate holder 100 is held not only by the adsorbing plate 224 but also by the anti-disengagement blocks 230 and 240. Consequently, if the substrate holder 100 becomes less tightly adsorbed by the adsorbing plate 224 and thus falls out of the adsorbing plate 224, the substrate holder 100 keeps being held by the anti-disengagement blocks 230 and 240 and thus can be prevented from falling out.

According to the exemplary embodiment shown in FIGS. 1 to 11, the anti-disengagement section 360 has the pair of flat-plate sections 362 and 382. Alternatively, an anti-disengagement section including a single flat-plate section can be utilized.

According to the exemplary embodiment shown in FIGS. 1 to 11, the substrate 10 is held by the substrate holder 100 and the substrate holder 100 is then placed on and transported by the substrate transporter 300. However, the transportation of the substrate 10 does not necessarily involve using the substrate holder 100. Alternatively, the substrate 10 may be placed directly on the placement surface of the substrate transporter 300. In this case, the substrate transporter 300 may be also provided with the anti-disengagement section 360 that moves back and forth in parallel to the surface of the substrate 10, thereby preventing the substrate 10 from falling out during the reversed orientation.

According to the above-described present embodiment, the connector terminals of the substrate holders 100 and 150 enable the substrate holders 100 and 150 to keep receiving power supply from the substrate transporter 300 while one of the substrate holders 100 and 150 or both of the stacked substrate holders 100 and 150 are being transported by the substrate transporter 300. Thus, the substrates 10 and 20 can be reliably transported in the state of being adsorbed by the substrate holders 100 and 150 by means of electrostatic force.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A substrate holder for holding a substrate by means of electrostatic force generated by power supplied from an external source, the substrate holder to be transported in a state of holding the substrate, the substrate holder comprising:
   a holder body that is to have the substrate placed thereon; and
   a connector terminal that is externally exposed to outside the holder body through a first surface of the holder body and a second surface of the holder body, the connector terminal operable to receive power supplied from an external power supply terminal via the first surface and operable to receive power supplied from an external power supply terminal via the second surface.

2. A substrate holder for holding a substrate by means of electrostatic force generated by power supplied from an external source, the substrate holder to be transported in a state of holding the substrate, the substrate holder comprising:
   a holder body that is to have the substrate placed thereon; and
   a connector terminal that is externally exposed, the connector terminal being attachable to and detachable from an external power supply terminal, wherein
   the substrate holder is transported in a state of being stacked on a different substrate holder that has a different connector terminal attachable to and detachable from an external power supply terminal, and
   the substrate holder further comprises
   an exposing section that, while the substrate holder is in the state of being stacked on the different substrate holder, externally exposes the connector terminal of the different substrate holder.

3. The substrate holder as set forth in claim 2, wherein the exposing section externally exposes the connector terminal of the different substrate holder towards a surface toward which the connector terminal of the substrate holder is externally exposed.

4. The substrate holder as set forth in claim 2, wherein the exposing section is a cutout or hole.

5. A substrate holder unit to be transported in a state of holding a plurality of substrates therein, the substrate holder unit comprising:
   a first substrate holder that holds one of the plurality of substrates by means of electrostatic force generated by power supplied from an external source; and
   a second substrate holder that holds the other of the plurality of substrates by means of electrostatic force generated by power supplied from an external source, wherein the first and second substrate holders each include:
   a holder body that is to have the substrate placed thereon;
   a connector terminal that is externally exposed to outside the holder body through a first surface of the holder body and a second surface of the holder body, the connector terminal operable to receive power supplied from an external power supply terminal via the first surface and operable to receive power supplied from an external power supply terminal via the second surface.

6. The substrate holder unit as set forth in claim 5, wherein one of the first and second substrate holders further includes
   an exposing section that, while the first and second substrate holders are in a state of being stacked on each other, externally exposes the connector terminal of the other of the first and second substrate holders.

7. The substrate holder unit as set forth in claim 6, wherein while the first and second substrate holders are in the state of being stacked on each other, the connector terminals of the first and second substrate holders are exposed toward a same surface.

8. The substrate holder unit as set forth in claim 6, wherein the exposing section is a cutout or hole.

9. The substrate holder unit as set forth in claim 5, wherein when a surface of the first substrate holder on which the substrate is to be placed faces a same direction as a surface of the second substrate holder on which the substrate is to be placed, the connector terminal of the first substrate holder is positioned at a same position as the connector terminal of the second substrate holder when seen from above.

10. The substrate holder unit as set forth in claim 9, wherein when the first and second substrate holders are stacked on each other with the surfaces on which the substrates are to be placed facing each other, the connector terminal of the first substrate holder is positioned at a different position than the connector terminal of the second substrate holder when seen from above.

11. The substrate holder unit as set forth in claim 5, wherein the first and second substrate holders each have a penetrating section that penetrates through the substrate holder from a surface on which the substrate is to be placed to an opposite surface,
   when a surface of the first substrate holder on which the substrate is to be placed faces a same direction as a surface of the second substrate holder on which the substrate is to be placed, the connector terminal of the first substrate holder is positioned at a same position as the connector terminal of the second substrate holder, and the penetrating section of the first substrate holder is positioned at a same position as the penetrating section of the second substrate holder, and
   when the first and second substrate holders are stacked on each other with the surfaces on which the substrates are to be placed facing each other, the penetrating section of one of the first and second substrate holders is positioned so as to overlap the connector terminal of the other of the first and second substrate holders.

12. A substrate transport apparatus for transporting a substrate holder, the substrate transport apparatus comprising:
the substrate holder as set forth in claim 1;
a placement section that has a placement surface on which the substrate holder is placed, the placement section holding the substrate holder; and
a power supply terminal that supplies power to the substrate holder placed on the placement surface.

13. The substrate transport apparatus as set forth in claim 12, wherein
the power supply terminal includes one or more lower power supply terminals and one or more upper power supply terminals, and
when two substrate holders are stacked on each other, the lower power supply terminals are electrically connected to a connector terminal of one of the two substrate holders that is positioned lower, and the upper power supply terminals are electrically connected to a connector terminal of the other of the two substrate holders that is positioned higher.

14. The substrate transport apparatus as set forth in claim 13, wherein
the lower and upper power supply terminals are arranged on the placement surface.

15. The substrate transport apparatus as set forth in claim 13, wherein
the lower power supply terminals have a height smaller than a thickness of the substrate holder that is positioned lower, and the upper power supply terminals have a height larger than the thickness of the substrate holder that is positioned lower.

16. The substrate transport apparatus as set forth in claim 13, further comprising
a rotation section that rotates the placement section between a normal orientation in which the placement surface is positioned under the substrate holder and a reversed orientation in which the placement surface is positioned above the substrate holder, wherein
the lower power supply terminals are symmetrically positioned with respect to a rotation axis of the placement section, and
the upper power supply terminals are asymmetrically positioned with respect to the rotation axis of the placement section.

17. The substrate transport apparatus as set forth in claim 16, further comprising
an anti-disengagement section that moves back and forth between (i) an anti-disengagement position in which the anti-disengagement section covers in a non-contact manner at least a portion of one of surfaces of the substrate and a portion of one of surfaces of the substrate holder and (ii) a retreat position in which the anti-disengagement section allows the substrate and the substrate holder to move along a vertical direction of the placement section, wherein
the anti-disengagement section moves back and forth parallel to the one of the surfaces of the substrate holder.

18. The substrate transport apparatus as set forth in claim 17, wherein
the anti-disengagement section has a flat-plate section that is parallel to the substrate and covers the one of the surfaces of the substrate and the one of the surfaces of the substrate holder, and
the flat-plate section has a plurality of flat-plate protrusions that are arranged outside the substrate and the substrate holder and protrude downward during the normal orientation of the placement section.

19. The substrate transport apparatus as set forth in claim 18, wherein
the plurality of flat-plate protrusions have such a dimension that the plurality of flat-plat protrusions do not contact the substrate and the substrate holder when the anti-disengagement section moves back and forth.

20. The substrate transport apparatus as set forth in claim 18, wherein
a surface of the flat-plate section that opposes the substrate has a recessed portion that is sized in accordance with the substrate.

21. The substrate transport apparatus as set forth in claim 18, wherein
an edge of the flat-plate section that is positioned outside the substrate and the substrate holder has a folded section that extends from the edge towards the placement surface, and
the folded section extends beyond the one of the surfaces of the substrate holder.

22. The substrate transport apparatus as set forth in claim 16, wherein
the placement section has a plurality of placement protrusions that are arranged outside the substrate and the substrate holder and protrude upward during the normal orientation of the placement section.

23. The substrate transport apparatus as set forth in claim 22, wherein
the plurality of placement protrusions have such a dimension that the plurality of placement protrusions do not contact the anti-disengagement section when the anti-disengagement section moves back and forth.

24. The substrate transport apparatus as set forth in claim 17, wherein
the placement section has an adsorbing section that adsorbs the substrate holder by means of vacuum.

25. A substrate bonding apparatus comprising: the substrate transport apparatus as set forth in claim 12; and
a bonding section that bonds together a plurality of substrates that are transported by the substrate transport apparatus.

26. A substrate holder to be transported in a state of holding a substrate, the substrate holder comprising:
a holder body that is to have the substrate placed thereon;
an electrode that is provided on the holder body, the electrode using power supplied from outside the holder body to generate an adsorbing force to adsorb the substrate;
a first terminal that is electrically connected to the electrode and is externally exposed to outside the holder body through a first surface of the holder body, the first terminal operable to receive power supplied from outside the holder body via the first surface; and
a second terminal that is electrically connected to the electrode and the first terminal and is externally exposed to outside the holder body through a second surface of the holder body, the second terminal operable to receive power supplied from outside the holder body via the second surface.

27. A substrate holder to be transported in a state of holding a substrate, the substrate holder comprising:
a holder body that is to have the substrate placed thereon;
an electrode that is provided on the holder body, the electrode using power supplied from outside the holder body to generate an adsorbing force to adsorb the substrate;

a first terminal that is electrically connected to the electrode, the first terminal operable to receive power supplied from outside the holder body via a first surface of the holder body; and a second terminal that is electrically connected to the electrode and the first terminal, the second terminal operable to receive power supplied from outside via a second surface of the holder body, wherein the substrate holder is transported in a state of being stacked on a different substrate holder that has a connector terminal attachable to and detachable from an external power supply terminal, and the substrate holder further comprises an exposing section that, while the substrate holder is in the state of being stacked on the different substrate holder, externally exposes the connector terminal of the different substrate holder.

28. The substrate holder as set forth in claim 1, wherein the connector terminal is disposed within the holder body and recessed with respect to the first and second surfaces of the holder body.

29. The substrate holder unit as set forth in claim 5, wherein in each of the first and second substrate holders, at least one of the first terminal and the second terminal is disposed within the holder body and recessed with respect to the first and second surfaces of the holder body.

30. The substrate holder as set forth in claim 1, wherein the connector terminal is connectable to different external power supply terminals via the first surface and the second surface.

31. The substrate holder as set forth in claim 1, wherein the first surface and the second surface respectively face different directions from each other.

32. The substrate holder as set forth in claim 27, wherein the first terminal is externally exposed on a placement surface of the holder body on which the substrate is to be placed, the second terminal is externally exposed on a back surface of the holder body that is opposite to the placement surface, and the exposing section externally exposes the connector terminal of the different substrate holder towards the back surface.

33. The substrate holder as set forth in claim 27, wherein the exposing section is a cutout or hole.

34. The substrate holder unit as set forth in claim 5, wherein the connector terminal is capable of abutting against different external power supply terminals via the first surface and the second surface.

35. The substrate holder unit as set forth in claim 5, wherein the first surface and the second surface respectively face different directions from each other.

36. The substrate holder unit as set forth in claim 5, wherein while the first substrate holder and the second substrate holder are in a state of being stacked on each other, the connector terminal of the first substrate holder and the connector terminal of the second substrate holder are externally exposed toward the same surface.

37. The substrate holder unit as set forth in claim 5, wherein the connector terminal of the first substrate holder is positioned at the same position as the connector terminal of the second substrate holder when a surface of the first substrate holder on which the substrate is to be placed faces the same direction as a surface of the second substrate holder on which the substrate is to be placed.

38. The substrate holder unit as set forth in claim 5, wherein when the first substrate holder and the second substrate holder are stacked on each other in such a manner that a surface of the first substrate holder on which the substrate is to be placed faces a surface of the second substrate holder on which the substrate is to be placed, the connector terminal of the first substrate holder and the connector terminal of the second substrate holder are positioned at different positions on the surfaces.

39. The substrate holder unit as set forth in claim 5, wherein at least one of the first substrate holder and the second substrate holder has a penetrating section that penetrates through the substrate holder from a placement surface on which the substrate is to be placed to an opposite back surface, when the placement surface of the first substrate holder faces the same direction as the placement surface of the second substrate holder, the connector terminal of the first substrate holder is positioned at the same position as the connector terminal of the second substrate holder, and when the first substrate holder and the second substrate holder are stacked on each other in such a manner that the placement surfaces face each other, the penetrating section is positioned so as to overlap the connector terminal of one of the first substrate holder and the second substrate holder.

40. The substrate holder unit as set forth in claim 39, wherein each of the first substrate holder and the second substrate holder has the penetrating section, and when the placement surface of the first substrate holder faces the same direction as the placement surface of the second substrate holder, the penetrating section of the first substrate holder is positioned at the same position as the penetrating section of the second substrate holder.

41. The substrate holder unit as set forth in claim 39, wherein the penetrating section is a cutout or hole.

42. A substrate bonding apparatus, comprising:

the substrate holder as set forth in claim 1; and a substrate transport apparatus for transporting the substrate holder, the substrate transport apparatus including:

a placement section that has a placement surface on which the substrate holder is placed, the placement section holding the substrate holder; and a power supply terminal that supplies power to the substrate holder placed on the placement surface.

43. The substrate bonding apparatus as set forth in claim 42, wherein the power supply terminal includes one or more lower power supply terminals and one or more upper power supply terminals, and when two substrate holders are stacked on each other, the lower power supply terminals are electrically connected to a connector terminal of one of the two substrate holders that is positioned lower, and the upper power supply terminals are electrically connected to a connector terminal of the other of the two substrate holders that is positioned higher.

44. The substrate bonding apparatus as set forth in claim 43, wherein the lower and upper power supply terminals are arranged on the placement surface.

45. The substrate bonding apparatus as set forth in claim 43, wherein
the lower power supply terminals have a height smaller than a thickness of the substrate holder that is positioned lower, and the upper power supply terminals have a height larger than the thickness of the substrate holder that is positioned lower.

46. The substrate bonding apparatus as set forth in claim 43, wherein
the substrate transport apparatus further includes
a rotation section that rotates the placement section between a normal orientation in which the placement surface is positioned under the substrate holder and a reversed orientation in which the placement surface is positioned above the substrate holder,
the lower power supply terminals are symmetrically positioned with respect to a rotation axis of the placement section, and
the upper power supply terminals are asymmetrically positioned with respect to the rotation axis of the placement section.

47. The substrate bonding apparatus as set forth in claim 46, wherein
the substrate transport apparatus further includes
an anti-disengagement section that moves back and forth between (i) an anti-disengagement position in which the anti-disengagement section covers in a non-contact manner at least a portion of one of surfaces of the substrate and a portion of one of surfaces of the substrate holder and (ii) a retreat position in which the anti-disengagement section allows the substrate and the substrate holder to move along a vertical direction of the placement section, and
the anti-disengagement section moves back and forth parallel to the one of the surfaces of the substrate holder.

48. The substrate bonding apparatus as set forth in claim 47, wherein
the anti-disengagement section has a flat-plate section that is parallel to the substrate and covers the one of the surfaces of the substrate and the one of the surfaces of the substrate holder, and
the flat-plate section has a plurality of flat-plate protrusions that are arranged outside the substrate and the substrate holder and protrude downward during the normal orientation of the placement section.

49. The substrate bonding apparatus as set forth in claim 48, wherein
the plurality of flat-plate protrusions have such a dimension that the plurality of flat-plat protrusions do not contact the substrate and the substrate holder when the anti-disengagement section moves back and forth.

50. The substrate bonding apparatus as set forth in claim 48, wherein
a surface of the flat-plate section that opposes the substrate has a recessed portion that is sized in accordance with the substrate.

51. The substrate bonding apparatus as set forth in claim 48, wherein
an edge of the flat-plate section that is positioned outside the substrate and the substrate holder has a folded section that extends from the edge towards the placement surface, and
the folded section extends beyond the one of the surfaces of the substrate holder.

52. The substrate bonding apparatus as set forth in claim 46, wherein
the placement section has a plurality of placement protrusions that are arranged outside the substrate and the substrate holder and protrude upward during the normal orientation of the placement section.

53. The substrate bonding apparatus as set forth in claim 52, wherein
the plurality of placement protrusions have such a dimension that the plurality of placement protrusions do not contact the anti-disengagement section when the anti-disengagement section moves back and forth.

54. The substrate bonding apparatus as set forth in claim 47, wherein
the placement section has an adsorbing section that adsorbs the substrate holder by means of vacuum.

55. The substrate bonding apparatus as set forth in claim 42, further comprising
a bonding section that bonds together a plurality of substrates that are transported by the substrate transport apparatus.

56. A substrate holder for holding a substrate by means of electrostatic force generated by power supplied from an external source, the substrate holder to be transported in a state of holding the substrate, the substrate holder comprising:
a holder body that is to have the substrate placed thereon; and
a connector terminal that is externally exposed, the connector terminal being attachable to and detachable from an external power supply terminal, wherein
the substrate holder is transported in a state of being stacked on a different substrate holder that has a connector terminal attachable to and detachable from an external power supply terminal, and
the substrate holder further comprises
a power access section that, while the substrate holder is in the state of being stacked on the different substrate holder, allows the connector terminal of the different substrate holder to access a power supply.

57. The substrate holder as set forth in claim 56, wherein
the power access section externally exposes the connector terminal of the different substrate holder towards a surface toward which the connector terminal of the substrate holder is externally exposed.

58. The substrate holder as set forth in claim 56, wherein
the power access section is a cutout or hole.

59. The substrate holder unit as set forth in claim 5, wherein
one of the first and second substrate holders further includes
a power access section that, while the first and second substrate holders are in a state of being stacked on each other, allows the connector terminal of the other of the first and second substrate holders to access a power supply.

60. The substrate holder unit as set forth in claim 59, wherein
while the first and second substrate holders are in the state of being stacked on each other, the connector terminals of the first and second substrate holders are exposed toward a same surface.

61. The substrate holder unit as set forth in claim 59, wherein
the power access section is a cutout or hole.

62. A substrate holder to be transported in a state of holding a substrate, the substrate holder comprising:
- a holder body that is to have the substrate placed thereon;
- an electrode that is provided on the holder body, the electrode using power supplied from outside the holder body to generate an adsorbing force to adsorb the substrate;
- a first terminal that is electrically connected to the electrode, the first terminal operable to receive power supplied from outside the holder body via a first surface of the holder body; and
- a second terminal that is electrically connected to the electrode and the first terminal, the second terminal operable to receive power supplied from outside via a second surface of the holder body, wherein
- the substrate holder is transported in a state of being stacked on a different substrate holder that has a connector terminal attachable to and detachable from an external power supply terminal, and
- the substrate holder further comprises
- a power access section that, while the substrate holder is in the state of being stacked on the different substrate holder, allows the connector terminal of the different substrate holder to access a power supply.

63. The substrate holder as set forth in claim 62, wherein
- the first terminal is externally exposed on a placement surface of the holder body on which the substrate is to be placed,
- the second terminal is externally exposed on a back surface of the holder body that is opposite to the placement surface, and
- the power access section externally exposes the connector terminal of the different substrate holder towards the back surface.

64. The substrate holder as set forth in claim 62, wherein the power access section is a cutout or hole.

* * * * *